US012808967B2

(12) United States Patent
McGrath

(10) Patent No.: US 12,808,967 B2
(45) Date of Patent: Nov. 24, 2026

(54) CALIBRATION OF MAGNETOMETERS

(71) Applicant: Dolby Laboratories Licensing Corporation, San Francisco, CA (US)

(72) Inventor: David S. McGrath, Rose Bay (AU)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 260 days.

(21) Appl. No.: 18/550,917

(22) PCT Filed: Apr. 19, 2022

(86) PCT No.: PCT/US2022/025350
§ 371 (c)(1),
(2) Date: Sep. 15, 2023

(87) PCT Pub. No.: WO2022/225929
PCT Pub. Date: Oct. 27, 2022

(65) Prior Publication Data

US 2024/0151799 A1 May 9, 2024

Related U.S. Application Data

(60) Provisional application No. 63/177,699, filed on Apr. 21, 2021.

(51) Int. Cl.
*G01R 35/00* (2006.01)
*G01C 25/00* (2006.01)
(Continued)

(52) U.S. Cl.
CPC ......... *G01R 35/005* (2013.01); *G01C 25/005* (2013.01); *G01R 33/0206* (2013.01); *G06F 3/012* (2013.01); *G06F 3/0346* (2013.01)

(58) Field of Classification Search
CPC ... G06F 3/0346; G06F 3/012; G01R 33/0206; G01R 35/005; G01C 25/005
See application file for complete search history.

(56) References Cited

U.S. PATENT DOCUMENTS 6,636,826 B1 10/2003 Abe
9,068,843 B1 6/2015 Sohn
(Continued)

FOREIGN PATENT DOCUMENTS

DE 102016207665 A1 11/2017
EP 3276302 B1 5/2021

OTHER PUBLICATIONS

Vasilyuk, N., Calibration of Integral Magnetometer Linear Model Coefficients Using Simultaneous Measurements of a Three-Axis Gyro, Gyroscopy and Navigation, Feb. 13, 2019, 10:2, p. 99-110, Pleiades Publishing, Ltd., 13 pages.
(Continued)

*Primary Examiner* — Lee E Rodak
*Assistant Examiner* — Taqi R Nasir

(57) ABSTRACT

A method for performing calibration of magnetometers is provided. In some embodiments, the method involves obtaining a sequence of gyroscope measurements from one or more gyroscopes and a sequence of magnetometer measurements from one or more magnetometers. In some embodiments, the method involves determining a sequence of angular velocity estimates based on the sequence of gyroscope measurements. In some embodiments, the method involves determining a first estimate of a derivative of an external magnetic field based on the sequence of magnetometer measurements. In some embodiments, the method involves determining a second estimate of the derivative of the external magnetic field based on the sequence of angular velocity estimates. In some embodiments, the method involves identifying magnetometer calibration constants based on a difference between the first estimate of the derivative and the second estimate of the derivative.

19 Claims, 7 Drawing Sheets

(51) Int. Cl.
*G01R 33/02* (2006.01)
*G06F 3/01* (2006.01)
*G06F 3/0346* (2013.01)

(56) References Cited

U.S. PATENT DOCUMENTS

| | | | | |
|---|---|---|---|---|
| 9,207,079 | B2 | 12/2015 | Askarpour | |
| 9,599,694 | B2 | 3/2017 | Almalki | |
| 9,658,692 | B1 | 5/2017 | Keyes | |
| 10,724,863 | B2 | 7/2020 | Vasilyuk | |
| 2013/0320963 | A1* | 12/2013 | Carmel-Veilleux | G01R 33/0023 324/200 |
| 2013/0320966 | A1* | 12/2013 | Oliver | G01R 33/0035 324/202 |
| 2017/0343349 | A1 | 11/2017 | Han | |
| 2019/0297442 | A1* | 9/2019 | Lyren | H04S 7/303 |

OTHER PUBLICATIONS

Yang, D., et al., Complete Tri-Axis Magnetometer Calibration with a Gyro Auxiliary, Sensors, 17:1223, May 26, 2017 (doi:10.3390/s17061223), 21 pages.

* cited by examiner

CALIBRATION OF MAGNETOMETERS

CROSS-REFERENCE TO RELATED APPLICATIONS

This application is a U.S. National Stage of International Application No. PCT/US2022/025350, filed Apr. 19, 2022, which claims priority to U.S. provisional application 63/177,699, filed 21 Apr. 2021, all of which are incorporated herein by reference in their entirety.

TECHNICAL FIELD

This disclosure pertains to systems, methods, and media for calibration of magnetometers.

BACKGROUND

Magnetometers may be useful for determining orientation, e.g., an orientation of a head of a wearer of a device that includes an orientation tracking system. However, magnetometers may be difficult to calibrate. For example, a magnetometer may be affected by sources of a magnetic field, such as from other magnets that are in proximity to the magnetometer. As another example, some types of materials that are in proximity to the magnetometer (e.g., soft irons) may cause distortions in the magnetic field. Accordingly, systems, methods, and media for calibration of magnetometers is desired.

NOTATION AND NOMENCLATURE

Throughout this disclosure, including in the claims, the terms "speaker," "loudspeaker" and "audio reproduction transducer" are used synonymously to denote any sound-emitting transducer (or set of transducers). A typical set of headphones includes two speakers. A speaker may be implemented to include multiple transducers (e.g., a woofer and a tweeter), which may be driven by a single, common speaker feed or multiple speaker feeds. In some examples, the speaker feed(s) may undergo different processing in different circuitry branches coupled to the different transducers.

Throughout this disclosure, including in the claims, the expression performing an operation "on" a signal or data (e.g., filtering, scaling, transforming, or applying gain to, the signal or data) is used in a broad sense to denote performing the operation directly on the signal or data, or on a processed version of the signal or data (e.g., on a version of the signal that has undergone preliminary filtering or pre-processing prior to performance of the operation thereon).

Throughout this disclosure including in the claims, the expression "system" is used in a broad sense to denote a device, system, or subsystem. For example, a subsystem that implements a decoder may be referred to as a decoder system, and a system including such a subsystem (e.g., a system that generates X output signals in response to multiple inputs, in which the subsystem generates M of the inputs and the other X−M inputs are received from an external source) may also be referred to as a decoder system.

Throughout this disclosure including in the claims, the term "processor" is used in a broad sense to denote a system or device programmable or otherwise configurable (e.g., with software or firmware) to perform operations on data (e.g., audio, or video or other image data). Examples of processors include a field-programmable gate array (or other configurable integrated circuit or chips set), a digital signal processor programmed and/or otherwise configured to perform pipelined processing on audio or other sound data, a programmable general purpose processor or computer, and a programmable microprocessor chip or chip set.

SUMMARY

At least some aspects of the present disclosure may be implemented via methods. Some methods may involve obtaining a sequence of gyroscope measurements from one or more gyroscopes and a sequence of magnetometer measurements from one or more magnetometers. Some methods may involve determining a sequence of angular velocity estimates based on the sequence of gyroscope measurements. Some methods may involve determining a first estimate of a derivative of an external magnetic field based on the sequence of magnetometer measurements. Some methods may involve determining a second estimate of the derivative of the external magnetic field based on the sequence of angular velocity estimates. Some methods may involve identifying magnetometer calibration constants based on a difference between the first estimate of the derivative of the external magnetic field and the second estimate of the derivative of the external magnetic field, wherein the identified magnetometer calibration constants are usable for calibrating an orientation tracking system that comprises the one or more gyroscopes and the one or more magnetometers.

In some examples, the sequence of gyroscope measurements and the sequence of magnetometer measurements are obtained during movement of the orientation tracking system.

In some examples, identifying the magnetometer calibration constants comprises identifying the magnetometer calibration constants that minimize the difference between the first estimate of the derivative of the external magnetic field and the second estimate of the derivative of the external magnetic field.

In some examples, determining the first estimate of the derivative of the external magnetic field comprises determining a difference between at least two magnetometer measurements of the sequence of magnetometer measurements. In some examples, the at least two magnetometer measurements span a time duration within a range of about 80 milliseconds-120 milliseconds.

In some examples, determining the second estimate of the derivative of the external magnetic field comprises determining a product of a representation of a change in the sequence of angular velocity estimates and a representation of the sequence of magnetometer measurements.

In some examples, identifying the magnetometer calibration constants comprises identifying an eigenvector corresponding to a smallest eigenvalue of a matrix representative of the difference between the first estimate of the derivative of the external magnetic field and the second estimate of the derivative of the external magnetic field, and wherein elements of the eigenvector correspond to the magnetometer calibration constants. In some examples, some methods further involve: determining a second smallest eigenvalue of the matrix representative of the difference between the first estimate of the derivative of the external magnetic field and the second estimate of the derivative of the external magnetic field; and determining that a second sequence of gyroscope measurements and a second sequence of magnetometer measurements are to be obtained based on a ratio of the smallest eigenvalue to the second smallest eigenvalue.

In some examples, the sequence of angular velocity estimates is determined using the sequence of gyroscope measurements adjusted using gyroscope calibration constants, and wherein the gyroscope calibration constants are determined based on gyroscope measurements obtained while the orientation tracking system is held stationary.

In some examples, the sequence of angulator velocity estimates is determined using an initial set of gyroscope calibration constants, and the method further involves: determining a calibration error associated with the magnetometer calibration constants identified using the initial set of gyroscope calibration constants; updating the initial set of gyroscope calibration constants based on the calibration error to generate an updated set of gyroscope calibration constants; and determining updated magnetometer calibration constants using the updated set of gyroscope calibration constants. In some examples, the updated set of gyroscope calibration constants are determined using gradient descent.

In some examples, the one or more gyroscopes and the one or more magnetometers are disposed in or on headphones or a head-mounted display. In some examples, the method further involves: utilizing the magnetometer calibration constants to determine a spatial orientation of the headphones; and modifying spatial characteristics of audio presented via the headphones based at least in part on the spatial orientation of the headphones. In some examples, the spatial characteristics of the audio are modified in near real-time based on a continuous series of determinations of the spatial orientation of the headphones.

In some examples, the one or more gyroscopes are configured to measure rotation along three axes, and the one or more magnetometers are configured to measure magnetic field along the three axes.

In some examples, the method further involves: determining a calibration error associated with the identified magnetometer calibration constants; and causing an indication of the calibration error to be presented in a user interface. In some examples, the calibration error is determined based on a ratio of a smallest eigenvalue to a second smallest eigenvalue associated with a matrix representative of the difference between the first estimate of the derivative of the external magnetic field and the second estimate of the derivative of the external magnetic field. In some examples, the method further involves: obtaining a second sequence of gyroscope measurements and a second sequence of magnetometer measurements; identifying updated magnetometer calibration constants associated with the second sequence of gyroscope measurements and the second sequence of magnetometer measurements; determining a second calibration error associated with the updated magnetometer calibration constants; and updating the user interface with an indication of the second calibration error.

Some or all of the operations, functions and/or methods described herein may be performed by one or more devices according to instructions (e.g., software) stored on one or more non-transitory media. Such non-transitory media may include memory devices such as those described herein, including but not limited to random access memory (RAM) devices, read-only memory (ROM) devices, etc. Accordingly, some innovative aspects of the subject matter described in this disclosure can be implemented via one or more non-transitory media having software stored thereon.

At least some aspects of the present disclosure may be implemented via an apparatus. For example, one or more devices may be capable of performing, at least in part, the methods disclosed herein. In some implementations, an apparatus is, or includes, an audio processing system having an interface system and a control system. The control system may include one or more general purpose single- or multi-chip processors, digital signal processors (DSPs), application specific integrated circuits (ASICs), field programmable gate arrays (FPGAs) or other programmable logic devices, discrete gates or transistor logic, discrete hardware components, or combinations thereof.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION OF EMBODIMENTS

Figure 1:
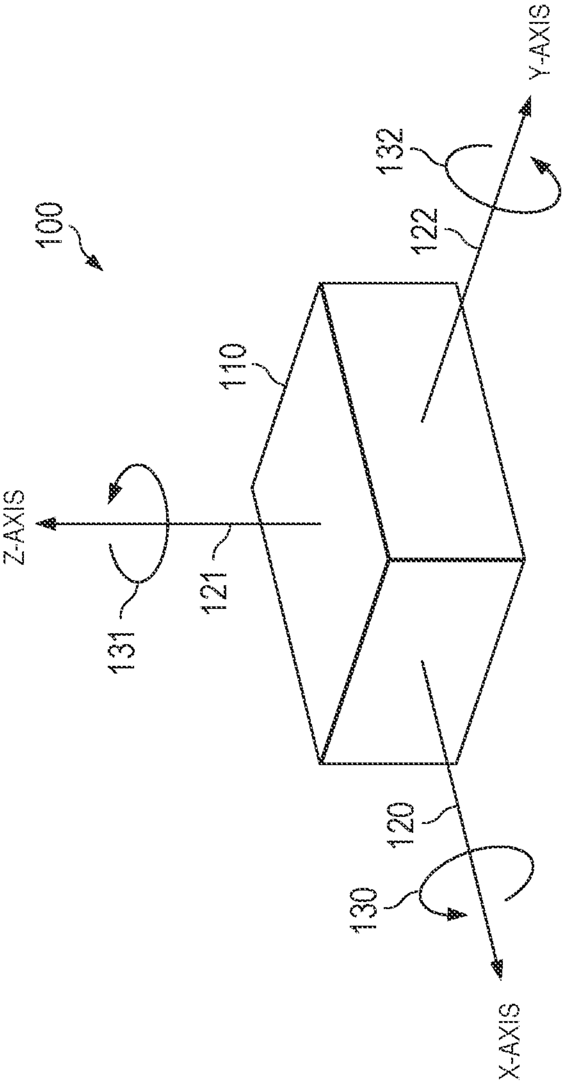
FIG. 1 is a schematic diagram that illustrates coordinate axes associated with an orientation tracking system in accordance with some embodiments.

Orientation tracking may be useful for various devices. For example, with respect to devices used for presentation of media content, such as headphones, virtual reality (VR) or augmented reality (AR) headsets, or the like, it may be useful to determine an orientation of a wearer's head in order to modify presentation of the media content in conjunction with the wearer's head orientation. By way of example, audio content may be rendered to have spatial characteristics, such that particular sounds are to be perceived as located in various spatial locations by the listener. Continuing with this example, when a listener is listening to such audio content wearing headphones, the audio content should be modified in accordance with the listener's head orientation such that the perceived spatial location of the audio content is stable even when the listener moves their head. Similar considerations are applicable to audio content and/or video content rendered using AR/VR headsets.

Orientation tracking is typically performed using inertial sensors, such as gyroscopes or accelerometers. However, such inertial sensors may not yield information that is sufficiently accurate for orientation tracking. For example, inertial sensors may provide information indicating a direction of gravity (e.g., in the case of accelerometers) and/or rates of angular rotation (e.g., in the case of gyroscopes). However, it may be difficult to determine spatial orientation (e.g., in terms of north, south, east, and west), particularly when the sensors are not actively being rotated. Accordingly, using magnetometer sensors in conjunction with inertial sensors may provide improved orientation tracking. However, magnetometer sensors are difficult to calibrate. For example, a magnetometer may be affected by sources of a magnetic field, such as from other magnets that are in proximity to the magnetometer. By way of example, a pair of headphones may include one or more magnets, e.g., within or proximate to the ear pieces. Measurements from a magnetometer disposed in or on the headphones may be affected by the one or more other magnets of the headphones. As another example, some types of materials that are in proximity to the magnetometer (e.g., soft irons) may cause distortions in the magnetic field.

Described herein are techniques for calibrating magnetometer sensors using data from gyroscope sensors. In particular, calibration constants for magnetometer sensors and optionally, for gyroscope sensors, may be determined by collecting calibration data during a time period when both the magnetometer sensors and the gyroscope sensors are rotated or moved in tandem. In some implementations, the calibration constants may be determined by determining two different estimates of the derivative of the external magnetic field. In particular, a first estimate may be determined based on changes in samples measured by the magnetometer sensor(s), and the second estimate may be determined based on the rate of change of an angular velocity as measured by the gyroscope sensor(s). Because, in an ideal situation, the two different estimates of the derivative of the external magnetic field are the same, the calibration constants may be determined as those that minimize a difference between the two different estimates.

In some implementations, the techniques described herein may be used to calibrate one or more magnetometer sensors and/or one or more gyroscope sensors that are disposed in and/or affixed to an orientation tracking system or device. In some embodiments, an orientation tracking system or device may additionally include one or more accelerometer sensors. In some embodiments, the orientation tracking system or device may be affixed to and/or embedded in a wearable device, such as headphones, a heads-up or head-mounted display, a virtual reality (VR) or augmented reality (AR) headset, smart glasses, or the like.

FIG. 1 shows an example 100 of an orientation tracking device 110 in accordance with some embodiments. In some embodiments, orientation tracking device 110 may include one or more magnetometers and one or more gyroscopes. In some implementations, measurements by the magnetometer(s) and the gyroscope(s) may be with respect to a frame of reference defined by the (x, y, z) coordinate system fixed to orientation tracking device 110. For example, a gyroscope (e.g., a 3-axis gyroscope) may measure angular velocity around particular coordinate axes. As a more particular example, an X-axis gyroscope may measure a component of rotation 130 around X-axis 120, a Y-axis gyroscope may measure a component of rotation 132 around Y-axis 122, and a Z-axis gyroscope may measure a component of rotation 131 around Z-axis 121. As another example, a magnetometer (e.g., a 3-axis magnetometer) may make measurements with respect to X-axis 120, Y-axis 122, and/or Z-axis 121.

As used herein, a 3-axis gyroscope may measure angular velocity around the X-axis, the Y-axis, and the Z-axis with a sampling time of ΔT. Accordingly, at a time t=n*ΔT, the angular velocity around the X-axis may be represented as $Gyr_x[n]$, the angular velocity around the Y-axis may be represented as $Gyr_y[n]$, and the angular velocity around the Z-axis may be represented as $Gyr_z[n]$. Similarly, a 3-axis magnetometer may make measurements with respect to the X-axis, the Y-axis, and the Z-axis. At time t, the measurements may be represented as $Meas_x[n]$, $Meas_y[n]$, and $Meas_z[n]$, respectively.

In some embodiments, angular velocity measurements may be corrected or modified to be more accurate. For example, angular velocity measurements obtained from a gyroscope may be corrected based on offset calibration constants (generally represented herein as $O_{Gyr,x}$, $O_{Gyr,y}$, and $O_{Gyr,y}$, for the X-axis, Y-axis, and Z-axis, respectively) and gain calibration constants (generally represented herein as $G_{Gyr,y}$, $G_{Gyr,y}$, and $G_{Gyr,z}$, for the X-axis, Y-axis, and Z-axis, respectively). Rot(t) is generally used herein to indicate a corrected angular velocity measurement at a time t, where Rot(t) may include corrected angular velocity measurements around the X-axis, Y-axis, and Z-axis, represented herein as $Rot_x(t)$, $Rot_y(t)$, and $Rot_z(t)$. For example, in some embodiments, Rot(t) may be determined by:

$$Rot(t) = \begin{pmatrix} Rot_x(t) \\ Rot_y(t) \\ Rot_z(t) \end{pmatrix} = \begin{pmatrix} G_{Gyr,x}(Gyr_x(t) - O_{Gyr,x}) \\ G_{Gyr,y}(Gyr_y(t) - O_{Gyr,y}) \\ G_{Gyr,z}(Gyr_z(t) - O_{Gyr,z}) \end{pmatrix}$$

In some embodiments, magnetometer measurements may be corrected or modified to be more accurate. For example, magnetometer measurements may be corrected based on offset calibration constants (generally represented herein as $O_{Mag,x}$, $O_{Mag,y}$, and $O_{Mag,z}$ for the X-axis, Y-axis, and Z-axis respectively), where the offset calibration constants account for magnetic fields generated within an orientation tracking device. As another example, magnetometer measurements may be corrected based on a 3×3 matrix $M_{mag}$ (formed by the calibration constants $M_{xx}$, $M_{xy}$, $M_{xz}$, $M_{yx}$, $M_{yy}$, $M_{yz}$, $M_{zx}$, $M_{zy}$, and $M_{zz}$), where the calibration constants compensate for distortions to the magnetic field due to the presence of materials such as iron, which may be contained in and/or attached to an orientation tracking device. In some embodiments, a corrected magnetic field measurement (e.g., corresponding to magnetometer measurements that have been corrected based on the calibration constants) at a time t=n*ΔT may be represented by Mag[n], which may have elements $Mag_x[n]$, $Mag_y[n]$, and $Mag_z[n]$. In some embodiments, Mag[n] may be determined by:

$$Mag[n] = M_{mag} * \begin{pmatrix} Meas_x[n] - O_{Mag,x} \\ Meas_y[n] - O_{Mag,y} \\ Meas_z[n] - O_{Mag,z} \end{pmatrix} = \begin{pmatrix} M_{xx} & M_{xy} & M_{xz} \\ M_{yx} & M_{yy} & M_{yz} \\ M_{zx} & M_{zy} & M_{zz} \end{pmatrix} * \begin{pmatrix} Meas_x[n] - O_{Mag,x} \\ Meas_y[n] - O_{Mag,y} \\ Meas_z[n] - O_{Mag,z} \end{pmatrix}$$

As described above, $O_{gyr}$, $G_{gyr}$, $O_{mag}$, and $M_{mag}$ are generally referred to herein as calibration constants. In some cases, gyroscope calibration constants may be determined by holding an orientation tracker device (e.g., that includes one or more gyroscope sensors) stationary and capturing gyroscope measurements during the time period when the device is held steady. The average of the measured values may then be used to determine gyroscope calibration constants, such as the gyroscope offset calibration constant ($O_{gyr}$). By way of example, in an instance in which the orientation tracker device is held stationary for T seconds (e.g., during a time t between 0 seconds and T seconds), the gyroscope offset calibration constants for each of the x, y, and z axes may be determined by:

$$O_{Gyr,x} = \frac{1}{T}\int_{t=0}^{T} Gyr_x(t)$$

$$O_{Gyr,y} = \frac{1}{T}\int_{t=0}^{T} Gyr_y(t)$$

$$O_{Gyr,z} = \frac{1}{T}\int_{t=0}^{T} Gyr_z(t)$$

Referring to quantized measurements, e.g., when a measurement n is taken at a time t=n*ΔT, the gyroscope calibration constants for each of the x, y, and z axes may be determined by:

$$O_{Gyr,x} = \frac{1}{N}\sum_{n=0}^{N-1} Gyr_x[n]$$

$$O_{Gyr,y} = \frac{1}{N}\sum_{n=0}^{N-1} Gyr_y[n]$$

$$O_{Gyr,z} = \frac{1}{N}\sum_{n=0}^{N-1} Gyr_z[n]$$

In some embodiments, the techniques described herein allow magnetic calibration constants (e.g., $O_{mag}$ and $M_{mag}$) to be determined based on magnetometer and gyroscope data that is collected concurrently, e.g., over the same time period. In some implementations, the magnetometer and gyroscope data may be collected during a time period during which an orientation tracker device that includes one or more magnetometers and one or more gyroscopes is rotated or otherwise moved such that the magnetometer and gyroscope data represents synchronous movement of the one or more magnetometers and one or more gyroscopes.

Figure 2:
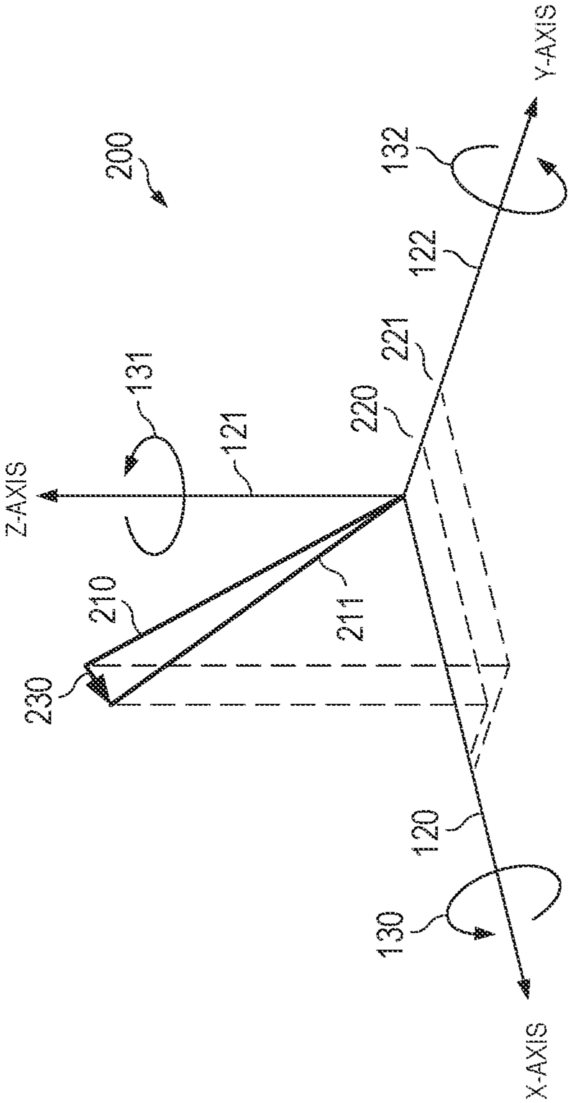
FIG. 2 is a schematic diagram that illustrates changes in magnetometer measurements in accordance with some embodiments.

In some implementations, magnetometer calibration constants and/or gyroscope calibration constants may be determined based on estimated changes in the estimated magnetic field. FIG. 2 shows a schematic diagram 200 that illustrates changes in an estimated magnetic field using the coordinate system shown in and described above in connection with FIG. 1. In the example depicted in FIG. 2, the vector 210 represents the estimated magnetic field vector at sample interval n, where the estimated magnetic field vector has components ($Mag_x[n]$, $Mag_y[n]$, $Mag_z[n]$). Vector 211 represents the estimated magnetic field vector at sample interval n+1, where the estimated magnetic field vector has components ($Mag_x[n+1]$, $Mag_y[n+1]$, $Mag_z[n+1]$). The values of the estimated environmental magnetic fields along the y-axis are shown as projections 220, and 221, respectively.

The change in the estimated magnetic field is shown in FIG. 2 as vector 230. The change in the estimated magnetic field (e.g., a derivative of the estimated magnetic field) may be estimated in different ways. For example, the derivative of the estimated magnetic field may be determined based on differences between magnetometer measurements across different samples. As a more particular example, the derivative of the magnetic field may be determined based on the difference between the magnetic field vector δ samples before and after a particular sample n. By way of example, the derivative of the magnetic field may be estimated based on a difference between magnetometer measurements by:

$$Mag'[n] = \frac{1}{2\delta}(Mag[n+\delta] - Mag[n-\delta])$$

As another example, in an instance in which magnetometer and gyroscope measurements are collected during co-rotation of the magnetometer and gyroscope sensors, changes in the estimated magnetic field may be assumed to be due to rotation of a frame of reference. Accordingly, the derivative of the estimated magnetic field may be determined based on a change in estimated angular velocity across samples as determined by gyroscope measurements. By way of example, the derivative of the magnetic field may be estimated based on changes in the estimated angular velocity by:

$$Mag'[n] = \Delta Rot[n] * Mag[n]$$

The techniques described herein utilize these two different estimates of the derivative of the magnetic field to determine magnetometer calibration constants and/or gyroscope calibration constants. In particular, in some implementations, because the two different estimates of the derivative of the magnetic field will ideally be the same, the calibration constants are selected to minimize a difference, or an error, between the two different estimates of the derivative of the magnetic field. More detailed techniques for determining magnetometer calibration constants based on two estimates of the derivative of the magnetic field are shown in and described below in connection with FIG. 3. FIG. 4 illustrates a process for determining both magnetometer calibration constants and gyroscope calibration constants based on two estimates of the derivative of the magnetic field.

Figure 3:
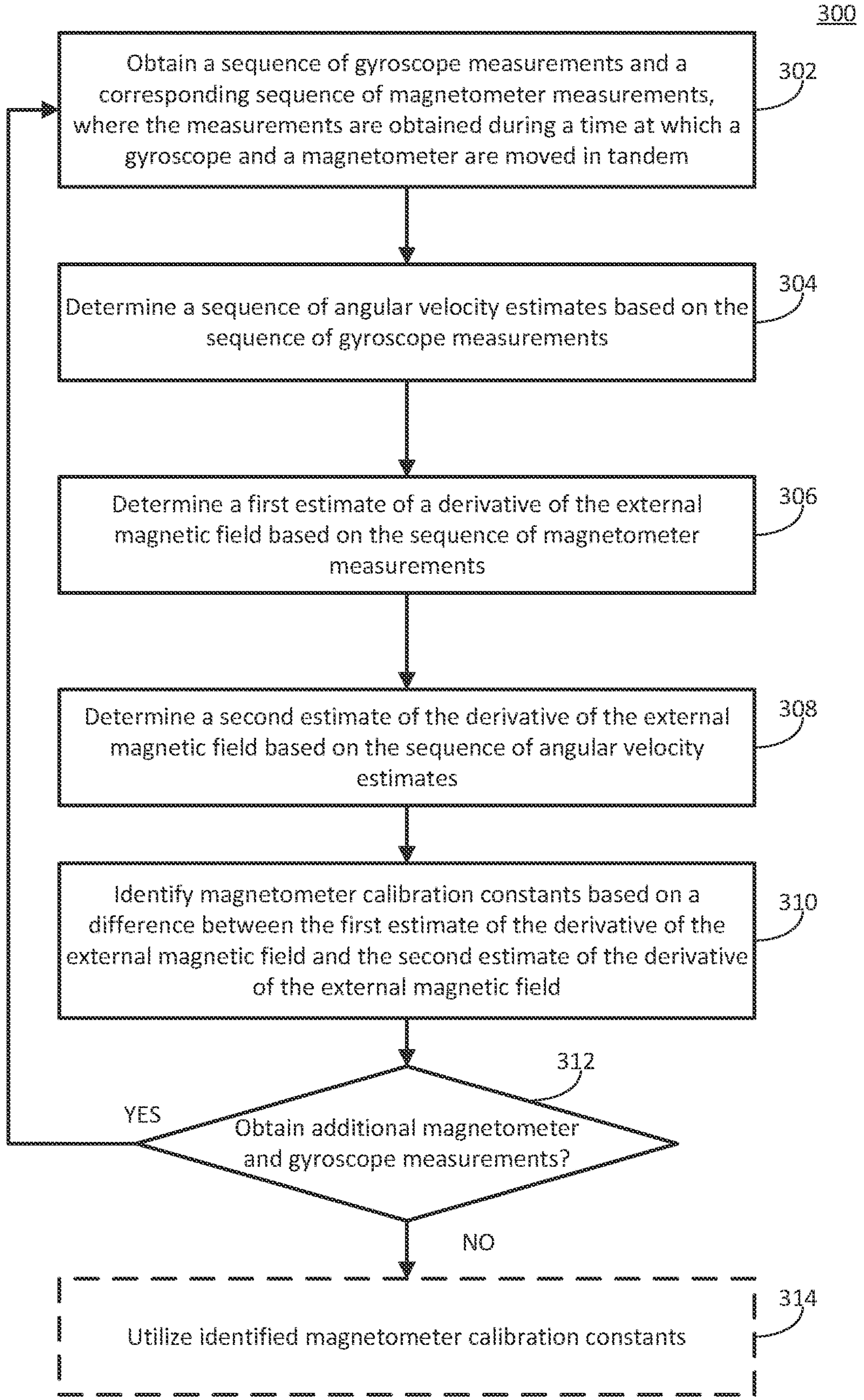
FIG. 3 is a flowchart of an example process for determining magnetometer calibration constants in accordance with some embodiments.
Figure 4:
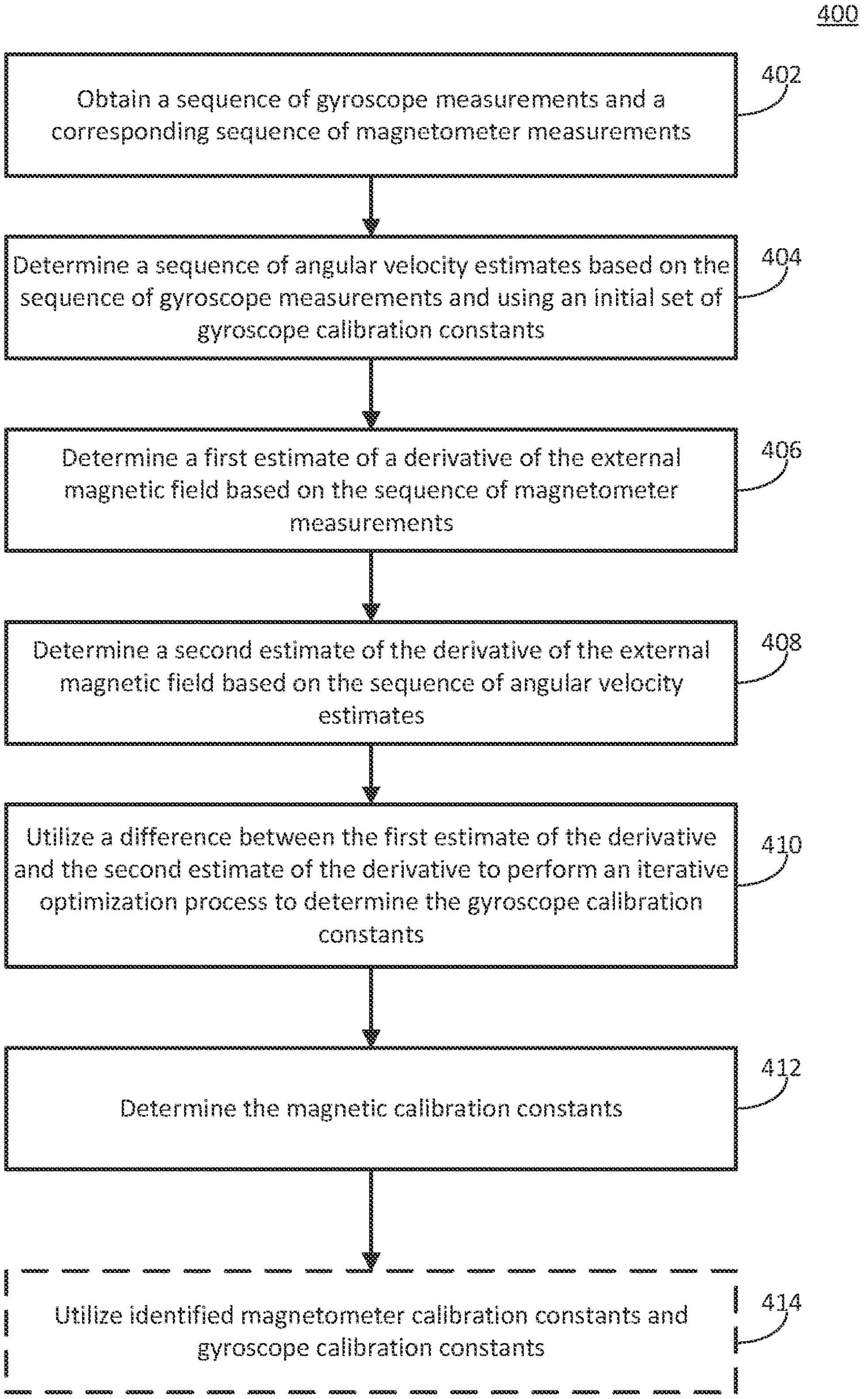
FIG. 4 is a flowchart of an example process for determining magnetometer calibration constants and gyroscope calibration constants in accordance with some embodiments.

FIG. 3 shows an example process 300 for determining magnetometer calibration constants based on two estimates of a derivative of a magnetic field in accordance with some embodiments. In some implementations, blocks of process 300 may be performed by a control system or a processor of an orientation tracking system that includes one or more magnetometers and one or more gyroscopes. In some embodiments, such an orientation tracking system may be part of or associated with a pair of headphones, a virtual reality headset, or the like. In some implementations, blocks of process 300 may be performed by a control system or a processor of a device that is paired with or associated with the orientation tracking system, such as a processor of an associated mobile phone or tablet computer. An example of such a control system is shown in and described below in connection with FIG. 7. It should be noted that, in some implementations, blocks of process 300 may be performed in an order other than what is shown in FIG. 3. In some embodiments, two or more blocks of process 300 may be performed substantially in parallel. In some embodiments, one or more blocks of process 300 may be omitted.

Process 300 can begin at 302 by obtaining a sequence of gyroscope measurements and a corresponding sequence of magnetometer measurements. In some embodiments, the gyroscope measurements and the magnetometer measurements may be obtained during a time period during which a corresponding gyroscope and magnetometer (e.g., from which the gyroscope measurements and the magnetometer measurements were obtained) were moved in tandem. For example, the gyroscope and magnetometer may be disposed in or on an orientation tracking system which is then moved (e.g., rotated, moved laterally, moved vertically, etc.). Assuming three-axis gyroscope measurements, for a particular sample n, the sequence of gyroscope measurements may be represented as:

$$Gyr[n] = (Gyr_x[n], Gyr_y[n], Gyr_z[n])^T$$

Assuming three-axis magnetometer measurements, for sample n, the sequence of magnetometer measurements may be represented as:

$$Meas[n]=(Meas_x[n],Meas_y[n],Meas_z[n])^T$$

It will be assumed herein that N samples are collected over a time period of T seconds, where samples are collected with a time difference of ΔT between samples. Example values of T (e.g., the time period over which gyroscope and magnetometer samples are collected) may be 30 milliseconds, 50 milliseconds, 80 milliseconds, 110 milliseconds, 150 milliseconds, 200 milliseconds, 250 milliseconds, 500 milliseconds, 1000 milliseconds, 1500 milliseconds, or the like. For example, in some implementations T may be within a range of about 50 milliseconds to 250 milliseconds, within a range of about 80 milliseconds to 150 milliseconds, within a range of about 100 milliseconds to 120 milliseconds, or the like. Example values of ΔT (e.g., a time difference between successive samples) may be 5 milliseconds, 10 milliseconds, 20 milliseconds, 50 milliseconds, or the like. It should be noted that, in some implementations, successive sets of samples may be collected until a sufficient amount of data to perform the calibration has been collected. The total amount of data (e.g., magnetometer and gyroscope measurements) may be collected over a time period such as 3 seconds, 5 seconds, 20 seconds, 60 seconds, 70 seconds, or the like.

At 304, process 300 can determine a sequence of angular velocity estimates based on the sequence of gyroscope measurements. For a sample n, a corresponding angular velocity estimate Rot[n] may be determined as having x, y, and z components. For example, Rot[n] may be represented as:

$$Rot[n]=(Rot_x[n],Rot_y[n],Rot_z[n])^T$$

In some embodiments, the angular velocity components may be determined based on gyroscope calibration constants, such as gyroscope offset constants ($O_{Gyr}$) and/or gyroscope gain constants ($G_{Gyr}$), as described above. For example, the angular velocity components may be determined by:

$$Rot[n]=\begin{pmatrix}Rot_x[n]\\Rot_y[n]\\Rot_z[n]\end{pmatrix}=\begin{pmatrix}G_{Gyr,x}(Gyr_x[n]-O_{Gyr,x})\\G_{Gyr,y}(Gyr_y[n]-O_{Gyr,y})\\G_{Gyr,z}(Gyr_z[n]-O_{Gyr,z})\end{pmatrix}$$

At 306, process 300 may determine a first estimate of a derivative of the external magnetic field based on the sequence of magnetometer measurements. For example, process 300 may determine the first estimate based on difference between magnetometer measurements δ samples before and after sample n. By way of example, the first estimate of the derivative of the external magnetic field may be determined by:

$$Meas_1'[n]=\begin{pmatrix}Meas_x'[n]\\Meas_y'[n]\\Meas_z'[n]\end{pmatrix}=\frac{1}{2\delta\Delta T}\begin{pmatrix}Meas_x[n+\delta]-Meas_x[n-\delta]\\Meas_y[n+\delta]-Meas_y[n+\delta]\\Meas_z[n+\delta]-Meas_z[n-\delta]\end{pmatrix}$$

In some implementations, the value of δ, which represents a number of samples of magnetometer measurements over which the derivative of the external magnetic field is estimated, may be selected to provide an estimate of the derivative of the magnetic field that is relatively noise-free. In other words, in some embodiments, the derivative may be calculated based on a number of samples that is large enough to reduce noise yet small enough to provide a suitable estimate of the derivative. In one example, δ may be determined as $$\left\lfloor\frac{0.05}{\Delta T}\right\rfloor.$$

In such cases, the derivative may be determined using samples of magnetometer measurements that span about 100 milliseconds.

At 308, process 300 can determine a second estimate of the derivative of the external magnetic field based on the sequence of angular velocity measurements. For example, in some embodiments, process 300 can determine a rotational rate of change (e.g., a rate of change of the angular velocity measurements), and can determine the second estimate of the derivative of the external magnetic field as a product of the rotational rate of change and the magnetic field vector. In one example, the rotational rate of change may be determined by:

$$\Delta Rot[n]=\Delta T*\begin{pmatrix}0&Rot_z[n]&-Rot_y[n]\\-Rot_z[n]&0&Rot_x[n]\\Rot_y[n]&-Rot_x[n]&0\end{pmatrix}$$

Continuing with this example, the second estimate of the derivative of the external magnetic field may be determined by:

$$Mag'_2[n]=\Delta Rot[n]*Mag[n]$$

Using expanded vectors that account for x, y, and z components, the second estimate of the derivative of the external magnetic field may be determined by:

$$\begin{pmatrix}Mag'_{2,x}[n]\\Mag'_{2,y}[n]\\Mag'_{2,z}[n]\end{pmatrix}=\Delta Rot[n]*\begin{pmatrix}Mag_x[n]\\Mag_y[n]\\Mag_z[n]\end{pmatrix}$$

At 310, process 300 can identify magnetometer calibration constants based on a difference between the first estimate of the derivative of the external magnetic field and the second estimate of the derivative of the external magnetic field. For example, in some implementations, process 300 may identify the magnetometer calibration constants as those that minimize the difference between the first estimate of the derivative of the external magnetic field and the second estimate of the derivative of the external magnetic field.

Described below are example techniques for identifying the magnetometer calibration constants by identifying an eigenvector corresponding to the minimum eigenvalue of a matrix that represents the difference between the first estimate of the derivative of the external magnetic field and the second estimate of the derivative of the external magnetic field.

It should be noted that the magnetic calibration constants may be represented as:

$$Mag[n]=M_{mag}*(Meas[n]-O_{mag})=M_{mag}*Meas[n]+Q_{mag}$$

In the equation given above, $Q_{mag}=-M_{mag}*O_{mag}$.

Using the above equation, the second estimate of the derivative of the external magnetic field may be represented as:

$$\text{Mag}'_2[n]=\Delta\text{Rot}[n]*\text{Mag}[n]=\Delta\text{Rot}[n]*M_{mag}*\text{Meas}[n]+\Delta\text{Rot}[n]*Q_{mag}$$

Accordingly, an error vector which represents the difference between the two estimates of the derivative of the external magnetic field may be represented as:

$$\text{Err}[n]=\text{Mag}'_1[n]-\text{Mag}'_2[n]=M_{mag}*\text{Meas}'[n]-\Delta\text{Rot}[n]*M_{mag}*\text{Meas}[n]-\Delta\text{Rot}[n]*Q_{mag}$$

The magnetic calibration constants may be arranged into a 12×1 vector V, represented by:

$$V=\begin{pmatrix} Mag_{xx}\\ Mag_{yx}\\ Mag_{zx}\\ Mag_{xy}\\ Mag_{yy}\\ Mag_{zy}\\ Mag_{xz}\\ Mag_{yz}\\ Mag_{zz}\\ Q_{mag,x}\\ Q_{mag,y}\\ Q_{mag,z} \end{pmatrix}$$

As noted above, $Q_{mag}$ includes a representation of the magnetic offset calibration constants, $O_{ma\ g}$. The error may then be represented by:

$$\text{Err}[n]=A[n]\times V$$

in some implementations, A[n] may be represented as:

$$A[n]=(\text{Meas}'[n]^T|0)\otimes I_3-(\text{Meas}[n]^T|1)\Delta\text{Rot}[n]$$

In the equation above, ⊗ represents the Kronecker product, and ( . . . | . . . ) represents a 1×4 augmented matrix formed by joining the 1×3 vector storing magnetic field measurements with a scalar constant.

In some implementations, process 300 may determine the vector V that minimizes the mean-square error Err[n] over a number of samples ($n=N_1, \ldots N_2$) based on the matrices A[n].

The total squared-error over a period of N samples may be represented as:

$$TotalErrPwr_{1..N}=\sum_{n=0}^{N-1}Err[n]^T\times Err[n]=\sum_{n=0}^{N-1}(A[n]\times V)^T\times(A[n]\times V)=$$

$$\sum_{n=0}^{N-1}V^T\times A[n]^T\times A[n]\times V=V^T\times\left(\sum_{n=0}^{N-1}A[n]^T\times A[n]\right)\times V=V^T\times B\times V$$

$$\text{Where: } B=\sum_{n=0}^{N-1}A[n]^T*A[n]$$

It will be appreciated that the TotalErrPwr may be minimized by setting the V vector to the zero vector. In an embodiment, we may apply the constraint that V is a unit-vector, and it will be appreciated that the unit-vector, V, that minimizes TotalErrPwr will be the eigenvector of B associated with the smallest eigenvalue.

Hence, a 12×12 matrix B may be generated by summing over multiple sample intervals. For example, in an instance in which N samples are collected, B may be generated by, for each of the N samples, multiplying A[n] transposed by A[n]. Because A[n] is a 3×12 matrix as described above, A[n] transposed multiplied by A[n] will generate a 12×12 matrix. The 12×12 matrix may then be summed over each of the N samples to generate a matrix B which effectively represents a difference between the two estimates of the derivative of the external magnetic field aggregated over all of the collected magnetometer and gyroscope samples. By way of example, B may be determined by:

$$B=\sum_{n=0}^{N-1}A[n]^T*A[n]$$

Continuing still further, the smallest eigenvalue of matrix B (generally referred to herein as $\lambda_1$) may be identified, along with the corresponding eigenvector v. Because matrix B is a 12×12 matrix, eigenvector v is a 12-element vector. Accordingly, a 3×3 matrix C may be determined as:

$$C=\begin{pmatrix} v_1 & v_4 & v_7\\ v_2 & v_5 & v_8\\ v_3 & v_6 & v_9 \end{pmatrix}$$

Similarly, a 3×1 vector d may be determined as:

$$d=\begin{pmatrix} v_{10}\\ v_{11}\\ v_{12} \end{pmatrix}$$

The magnetic offset calibration constants and the magnetic calibration matrix may be determined based on the C matrix and the d vector. For example, the magnetic offset calibration constants may be determined by:

$$\begin{pmatrix} O_{Mag,x}\\ O_{Mag,y}\\ O_{Mag,z} \end{pmatrix}=-C^{-1}*d$$

The magnetic calibration matrix may be determined by:

$$M_{Mag}=\begin{pmatrix} M_{xx} & M_{xy} & M_{xz}\\ M_{yx} & M_{yy} & M_{yz}\\ M_{zx} & M_{zy} & M_{zz} \end{pmatrix}=s*C$$

In the equation given above, s represents an arbitrary scale factor. In some implementations, s may be determined based on the C matrix, for example, to generate the magnetic calibration matrix such that the magnetic calibration matrix has diagonal elements that are close to unity. By way of example, in some implementations, s may be $$\frac{3}{tr(c)}.$$

At 312, process 300 may determine whether additional magnetometer and gyroscope measurements are to be obtained. In some implementations, process 300 may determine whether additional magnetometer measurements and additional gyroscope measurements are to be obtained based on an error metric. For example, process 300 may determine that additional magnetometer measurements and additional gyroscope measurements are to be obtained responsive to determining that the error metric exceeds a predetermined threshold.

In some embodiments, the error metric may be a ratio (generally represented herein as "q") of the smallest eigenvalue to the next smallest eigenvalue. As a specific example, the error metric may be determined by:

$$q = \frac{\lambda_1}{\lambda_2}$$

In some implementations, process 300 may determine that additional magnetometer and gyroscope measurements are to be obtained based on a value of q. For example, process 300 may determine that additional magnetometer and gyroscope measurements are to be obtained responsive to q being above a predetermined threshold of 0.15, 0.2, 0.25, 0.3, and/or any other suitable threshold.

If, at 312, process 300 determines that additional magnetometer and gyroscope measurements are to be obtained ("yes" at 312), process 300 can loop back to block 302 and obtain an additional sequence of magnetometer and gyroscope measurements. Note that, in instances in which additional magnetometer and gyroscope measurements are obtained, process 300 may update the error matrix B based on the additional measurements without fully recalculating the error matrix. This may allow process 300 to utilize new data without discarding previously collected measurements. By way of example, in an instance in which matrix B was originally determined (e.g., at block 310, as described above) using N samples from 0 to N−1, and in which additional samples are collected, labeled from $N_1$ to $N_2$, matrix B may be updated using:

$$B \leftarrow B + \sum_{n=N_1}^{N_2} A[n]^T * A[n]$$

In some implementations, process 300 may loop through blocks 302-312 until the error metric (e.g., q) is below the predetermined threshold (or, alternatively, until a time-out period has elapsed).

Conversely, if, at 312, it is determined that additional magnetometer and gyroscope measurements are not to be obtained ("no" at 312), process 300 can optionally proceed to block 314 and can utilize the magnetometer calibration constants. In some implementations, the magnetometer calibration constants may be utilized when presenting scene-based audio content. For example, in some embodiments, the magnetometer calibration constants may be utilized to determine a more accurate head orientation of a wearer of a pair of headphones, and to adjust the spatial rendering of audio content presented via the headphones based on the determined head orientation. In some implementations, the magnetometer calibration constants may be utilized when presenting content via virtual reality (VR) or augmented reality (AR) headsets. For example, the magnetometer calibration constants may be utilized to determine a more accurate head orientation, and to adjust the spatial rendering of visual content and/or audio content presented via the VR or AR headset based on the determined head orientation. It should be noted that, in some implementations, the determined magnetometer calibration constants may be stored in association with a particular device (e.g., headphones, headset, etc.) such that the magnetometer calibration constants are utilized upon device utilization (e.g., responsive to in-ear or on-ear detection with headphones, or the like).

In some implementations, gyroscope gain calibration constants may be determined concurrently with magnetometer calibration constants. For example, initial gyroscope gain calibration constants may be set. Continuing with this example, initial magnetometer calibration constants may be identified, using, e.g., the techniques shown in and described above in connection with FIG. 3. More particularly, initial magnetometer calibration constants may be determined using a matrix representative of a difference between two estimates of the external magnetic field (e.g., matrix B as described above in connection with block 310 of FIG. 3). Continuing still further with this example, in some embodiments, the initial gyroscope gain calibration constants may be modified to values that yield a lower error metric associated with the initial magnetometer calibration constants. As a more particular example, in an instance in which the error metric corresponds to a ratio of the smallest eigenvalue of the derivative difference matrix to the second smallest eigenvalue (e.g., as described above in connection with block 312 of FIG. 3), the initial gyroscope gain calibration constants may be modified in a manner which decreases the ratio. In some implementations, the gyroscope gain calibration constants may be iteratively adjusted, for example, until the ratio of the smallest eigenvalue to the second smallest eigenvalue is at a minimum level. In some embodiments, the gyroscope gain calibration constants may be iteratively adjusted using gradient descent, and/or any other suitable iterative optimization algorithm.

FIG. 4 shows an example process 400 for iteratively adjusting gyroscope calibration constants in accordance with some embodiments. In some implementations, blocks of process 400 may be performed by a control system or a processor of an orientation tracking system that includes one or more magnetometers and one or more gyroscopes. An example of a control system that may implement blocks of process 400 is shown in and described below in connection with FIG. 7. In some embodiments, such an orientation tracking system may be part of or associated with a pair of headphones, a virtual reality headset, or the like. In some implementations, blocks of process 400 may be performed by a control system or a processor of a device that is paired with or associated with the orientation tracking system, such as a processor of an associated mobile phone or tablet computer. It should be noted that, in some implementations, blocks of process 400 may be performed in an order other than what is shown in FIG. 4. In some embodiments, two or more blocks of process 400 may be performed substantially in parallel. In some embodiments, one or more blocks of process 400 may be omitted.

Process 400 can begin at 402 by obtaining a sequence of gyroscope measurements and a corresponding sequence of magnetometer measurements. Similar to what is described above in connection with block 302 of FIG. 3, in some embodiments, the gyroscope measurements and the magnetometer measurements may be obtained over a time period during which a corresponding gyroscope and magnetometer (e.g., from which the gyroscope measurements and the magnetometer measurements were obtained) were moved in tandem. For example, the gyroscope and magnetometer may be disposed in or on an orientation tracking system which is then moved (e.g., rotated, moved laterally, moved vertically, etc.). Assuming three-axis gyroscope measurements, for a particular sample n, the sequence of gyroscope measurements may be represented as:

$$\mathrm{Gyr}[n]=(\mathrm{Gyr}_x[n],\mathrm{Gyr}_y[n],\mathrm{Gyr}_z[n])^T$$

Assuming three-axis magnetometer measurements, for sample n, the sequence of magnetometer measurements may be represented as:

$$\mathrm{Meas}[n]=(\mathrm{Meas}_x[n],\mathrm{Meas}_y[n],\mathrm{Meas}_z[n])^T$$

At 404, process 400 may determine a sequence of angular velocity estimates based on the sequence of gyroscope measurements and using an initial set of gyroscope calibration constants. Similar to what is described above in connection with block 304 of FIG. 3, for a sample n, a corresponding angular velocity estimate Rot[n] may be determined as having x, y, and z components. For example, Rot[n] may be represented as:

$$\mathrm{Rot}[n]=(\mathrm{Rot}_x[n],\mathrm{Rot}_y[n],\mathrm{Rot}_z[n])^T$$

Note that, because the gyroscope calibration gain constants $G_{Gyr,x}$, $G_{Gyr,y}$, and $G_{Gyr,z}$ are determined using an optimization process, the angular velocity components may be determined by accounting for the gyroscope offset constants without accounting for the gain constants, unlike what is shown in and described above in connection with FIG. 3. For example, the angular velocity components may be determined by:

$$Rot[n]=\begin{pmatrix} Rot_x[n] \\ Rot_y[n] \\ Rot_z[n] \end{pmatrix}=\begin{pmatrix} Gyr_x[n]-O_{Gyr,x} \\ Gyr_y[n]-O_{Gyr,y} \\ Gyr_z[n]-O_{Gyr,z} \end{pmatrix}$$

At 406, process 400 can determine a first estimate of a derivative of the external magnetic field based on the sequence of magnetometer measurements. For example, process 400 can determine the first estimate (generally referred to herein as $\mathrm{Mag'}_1$) using the techniques described above in connection with block 406 (e.g., based on a difference between magnetometer samples). A particular example of an equation to determined $\mathrm{Mag'}_1$ is given by:

$$Meas_1'[n]=\begin{pmatrix} Meas_x'[n] \\ Meas_y'[n] \\ Meas_z'[n] \end{pmatrix}=\frac{1}{2\delta\Delta T}\begin{pmatrix} Meas_x[n+\delta]-Meas_x[n-\delta] \\ Meas_y[n+\delta]-Meas_y[n-\delta] \\ Meas_z[n+\delta]-Meas_z[n+\delta] \end{pmatrix}$$

At 408, process 400 can determine a second estimate of a derivative of the external magnetic field based on the sequence of angular velocity estimates determined at block 404. For example, as described above in connection with block 308 of FIG. 3, process 400 can determine the rotational rate of change (generally referred to herein as ΔRot) based on the sequence of angular velocity estimates. Continuing with this example, process 400 can determine the second estimate as the Kronecker product of the rotational rate of change and the magnetic field measurements, as described above in connection with block 308 of FIG. 3.

At 410, process 400 can utilize a difference between the first estimate of the derivative of the external magnetic field and the second estimate of the derivative of the external magnetic field to perform an iterative optimization process to determine the gyroscope calibration constants. For example, process 400 can determine a matrix A that represents a difference between the two estimates of the derivative of the external magnetic field. In one example, A[n] may be determined by:

$$A[n]=(\mathrm{Meas}'[n]^T\!=\!0)\lfloor I_3-(\mathrm{Meas}[n]^T|1)\lfloor\Delta\mathrm{Rot}[n]$$

In the equation given above, $I_3$ may be an identity matrix. In an instance in which A[n] is a 3×12 matrix, $I_3$ is a 3×3 matrix. In the equation given above, ⌊ is the Kronecker product. In the equation given above, and in an instance in which A[n] is a 3×12 matrix, ( . . . | . . . ) is a 1×4 augmented matrix, which may be formed by joining a 1×3 row vector with a scalar constant. It should be noted that each row vector within A[n] may be a 1×12 row vector, and is generally referred to herein as $A_1[n]$, $A_2[n]$, and $A_3[n]$.

Continuing with this example, three matrices, $B_1$, $B_2$, and $B_3$ may be determined using the corresponding row vectors $A_1[n]$, $A_2[n]$, and $A_3[n]$. In an instance in which A[n] is a 3×12 matrix, each of $B_1$, $B_2$, and $B_3$ may in turn be 12×12 matrices. In one example, $B_1$, $B_2$, and $B_3$ may be determined by summing over a predetermined number of sample intervals N. It should be noted that, in some implementations, the B1, B2, and B3 matrices may accumulate chunks of gyroscope and magnetometer measurements collected over e.g., 50 milliseconds, 100 milliseconds, 500 milliseconds, 1000 milliseconds, etc., and aggregated over time as the chunks of data are collected. This may allow a status of the calibration procedure to be determined and optionally provided to the user. Example equations for determining $B_1$, $B_2$, and $B_3$ are:

$$B_1=\sum_{n=0}^{N-1}A_1[n]^T*A_1[n]$$

$$B_2=\sum_{n=0}^{N-1}B_2[n]^T*B_2[n]$$

$$B_3=\sum_{n=0}^{N-1}B_3[n]^T*B_3[n]$$

Continuing with this example, an initial set of gain calibration constants, $G_{Gyr,x}$, $G_{Gyr,y}$, and $G_{Gyr,z}$ may be selected. An iterative process may then be performed to determine final values of the set of gain calibration constants. The iterative process may include first determining three-gain adjustment vectors, generally referred to herein as $q_1$, $q_2$, and $q_3$. In an instance in which A[n] is a 3×12 matrix, $q_1$, $q_2$, and $q_3$ may each be 12×1 vectors. In some implementations, $q_1$, $q_2$, and $q_3$ may be determined by:

$$q_1=([1,1,1,1]\otimes[1,G_{Gyr,z},G_{Gyr,y}])^T$$

$$q_2=([1,1,1,1]\otimes[G_{Gyr,z}1,G_{Gyr,x}])^T$$

$$q_3=([1,1,1,1]\otimes[G_{Gyr,y}G_{Gyr,x}1])^T$$

A 12×12 matrix B, from which the gyroscope gain calibration constants may be updated, may be determined based on $B_1$, $B_2$, and $B_3$ and the corresponding gain-adjusted vectors. For example, B may be determined by:

$$B=\mathrm{diag}(q_1)*B_1*\mathrm{diag}(q_2)+\mathrm{diag}(q_2)*B_2*\mathrm{diag}(q_2)+\mathrm{diag}(q_3)*B_3*\mathrm{diag}(q_3)$$

Continuing still further with this example, process 400 may determine the eigenvector v corresponding to the smallest eigenvalue $\lambda_1$ of the matrix B. Process 400 may additionally determine the second-smallest eigenvalue $\lambda_2$, and may determine a ratio, generally referred to herein as q, of the ratio of the smallest eigenvalue to the second-smallest eigenvalue. For example, q may be determined as:

$$\frac{\lambda_1}{\lambda_2}.$$

In some implementations, q may be considered an error metric that represents an error, or goodness of fit, of the calibration constants (e.g., magnetic calibration constants and/or gyroscope calibration constants) used to determine the first and second derivatives of the external magnetic field.

In some implementations, process 400 may repeat determining the gain adjustment vectors, determining the matrix B, and determining the eigenvector v corresponding to the smallest eigenvalue of B using a modified, or adjusted set of gyroscope gain calibration constants. In some embodiments, process 400 may repeat these steps to minimize the value of q. In some implementations, any suitable optimization technique may be used to determine modified values of the gyroscope gain calibration constants in order to minimize the value of q.

In an embodiment, an iterated process may be carried out wherein, at iteration i, a set of current best estimated gyroscope gain calibration constants, ($G_i$, a 3×1 vector) and a step-size, (e.g., s=0.01, 0.015, 0.02, or the like) may be chosen, and q may be calculated for a set of potential improved gain calibration constants:

$$SearchSet_i = \left\{\begin{pmatrix} G_{i,x} \\ G_{i,y} \\ G_{i,z} \end{pmatrix}\begin{pmatrix} G_{i,x}+s \\ G_{i,y} \\ G_{i,z} \end{pmatrix}\begin{pmatrix} G_{i,x} \\ G_{i,y}+s \\ G_{i,z} \end{pmatrix}\begin{pmatrix} G_{i,x} \\ G_{i,y} \\ G_{i,z}+s \end{pmatrix}\begin{pmatrix} G_{i,x}-s \\ G_{i,y} \\ G_{i,z} \end{pmatrix}\begin{pmatrix} G_{i,x} \\ G_{i,y}-s \\ G_{i,z} \end{pmatrix}\begin{pmatrix} G_{i,x} \\ G_{i,y} \\ G_{i,z}-s \end{pmatrix}\right\}$$

and improved best estimated gyroscope gain calibration constants, $G_{i+1}$, may be chosen as the member of $SearchSet_i$ that corresponds to the minimum q value. In some embodiments, the step-size, s, may be reduced in size after an iteration where $G_{i+1}=G_i$ (in other words, after any iteration where the alternative calibration values fail to lead to a lower q value).

At 412, after gyroscope gain calibration constants have been determined based on values of the gyroscope gain calibration constants that minimize q, process 400 can determine the magnetic calibration constants. Similar to what is described above in connection with block 310 of FIG. 3, process 400 an determine a matrix C using the eigenvector v corresponding to the smallest eigenvalue of B. Matrix C may be used to determine a magnetic calibration matrix. In particular, in some embodiments, C may be determined by:

$$C = \begin{pmatrix} v_1 & v_4 & v_7 \\ v_2 & v_5 & v_8 \\ v_3 & v_6 & v_9 \end{pmatrix}$$

The magnetic calibration matrix $M_{mag}$ may be determined by:

$$M_{Mag} = \begin{pmatrix} M_{xx} & M_{xy} & M_{xz} \\ M_{yz} & M_{yy} & M_{yz} \\ M_{zx} & M_{zy} & M_{zz} \end{pmatrix} = s * C$$

The remaining three elements of the eigenvector v may be used to determine the magnetic offset calibration constants. In particular, the remaining three elements may be used to construct a vector d. For example, d may be determined by:

$$d = \begin{pmatrix} v_{10} \\ v_{11} \\ v_{12} \end{pmatrix}$$

The magnetic offset calibration constants may then be determined by:

$$\begin{pmatrix} O_{Mag,x} \\ O_{Mag,y} \\ O_{Mag,z} \end{pmatrix} = -C^{-1} * d$$

At 414, process 400 can optionally utilize the identified magnetometer calibration constants and the gyroscope calibration constants. As described above in connection with block 314 of FIG. 3, the magnetometer calibration constants and the gyroscope calibration constants may be utilized in connection with headphones (e.g., to accurately present binaural sounds based on head orientation of a wearer of the headphones), AR/VR headsets (e.g., to accurately present visual and/or audio content based on head orientation of a wearer of the headset), or the like.

In some implementations, a calibration routine from which magnetometer calibration constants, and, optionally, gyroscope calibration constants are determined may be triggered using a user interface. In some implementations, the user interface may, for example, prompt a user of an orientation tracking device that includes one or more magnetometers and one or more gyroscopes to rotate and/or otherwise move the orientation tracking device in a particular manner. As a more particular example, in an instance in which the orientation tracking device is affixed on and/or disposed in a pair of headphones, the user interface may instruct the user to wear the headphones and subsequently rotate their head left, right, up, down, etc. In some implementations, the user interface may present real-time or near real-time information that indicates a current head orientation of the user. For example, in some implementations, the user interface may present an indication of a current direction (e.g., in north, south, east, west coordinates) associated with the user's head orientation. As another example, in some implementations, the user interface may continually update a real-time or near real-time animation depicting the current orientation of the user's head. In some implementations, the user interface may indicate a current error associated with a current estimate of the magnetometer calibration constants and optionally the gyroscope calibration constants. For example, the error may be continually updated as the user performs the calibration routine (e.g., as the user rotates their head while holding and/or wearing the orientation tracking device), and the user interface may correspondingly be updated to indicate the most recently determined error metric. In some implementations, the user interface may indicate when the calibration routine has been completed, for example, responsive to determining that the error associated with the magnetometer calibration constants and optionally the gyroscope calibration constants is below a predetermined threshold. In some embodiments, the user interface may prompt the user to save the determined calibration constants, for example, in association with a pair of headphones utilized in connection with the calibration routine. As will be described below, FIG. 5 illustrates an example process for performing such a calibration process using a user interface, and FIG. 6 shows an example of the user interface in accordance with some embodiments.

Figure 5:
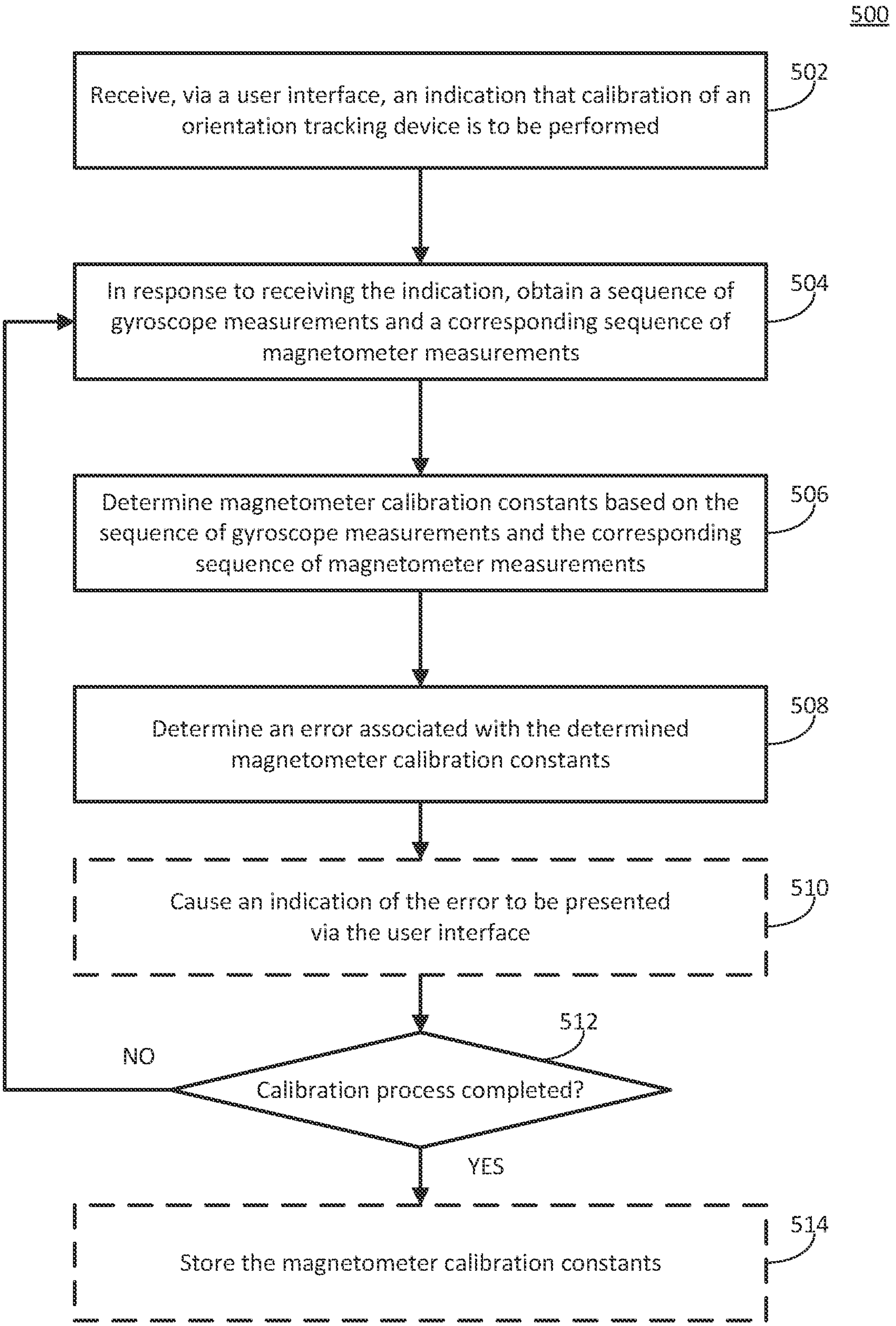
FIG. 5 is a flowchart of an example process for utilizing a user interface to perform a magnetometer calibration process in accordance with some embodiments.
Figure 6:
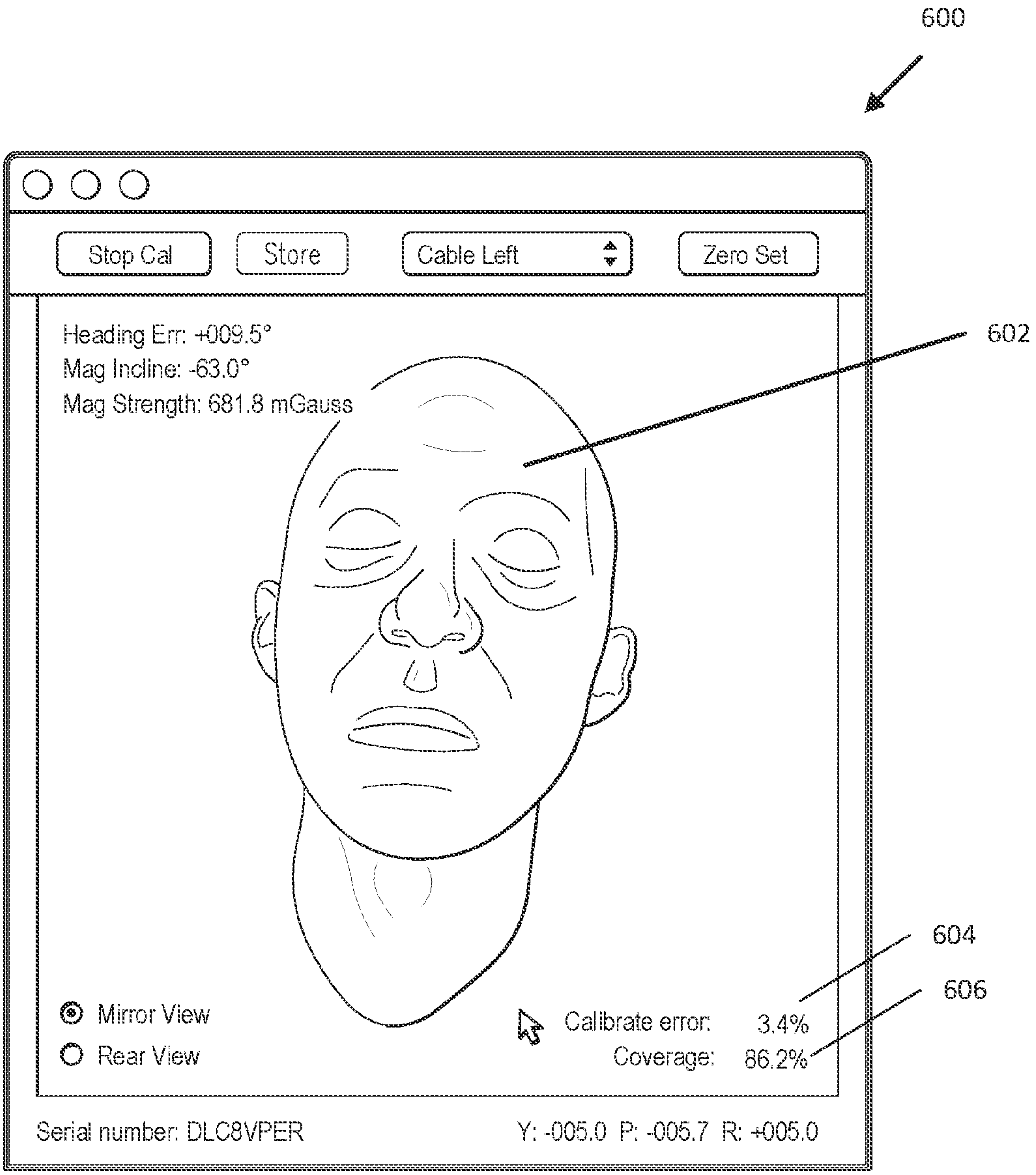
FIG. 6 is an example of a user interface used in connection with a magnetometer calibration process in accordance with some embodiments.

Turning to FIG. 5, a flowchart of an example process 500 for performing a calibration routine to determine magnetometer calibration constants and optionally gyroscope calibration constants using a user interface is shown in accordance with some embodiments. In some implementations, blocks of process 500 may be performed by a control system or a processor of an orientation tracking system that includes one or more magnetometers and one or more gyroscopes. An example of control system that may be used to execute blocks of process 500 is shown in and described below in connection with FIG. 6. In some embodiments, such an orientation tracking system may be part of or associated with a pair of headphones, a virtual reality headset, or the like. In some implementations, blocks of process 500 may be performed by a control system or a processor of a device that is paired with or associated with the orientation tracking system, such as a processor of an associated mobile phone, tablet computer, desktop computer, laptop computer, etc. It should be noted that, in some implementations, blocks of process 500 may be performed in an order other than what is shown in FIG. 5. In some embodiments, two or more blocks of process 500 may be performed substantially in parallel. In some embodiments, one or more blocks of process 500 may be omitted.

Process 500 can begin at 502 by receiving, via a user interface, an indication that calibration of an orientation tracking device is to be performed. For example, process 500 may receive the indication as selection of a "begin calibration" button presented on the user interface. In some implementations, responsive to receiving the indication, process 500 may cause instructions to the user to be presented via the user interface. For example, the instructions may indicate that the user is to wear headphones or a headset associated with the orientation tracking device and to begin rotating their head in various directions (e.g., up, down, left, right, etc.).

At 504, in response to receiving the indication, process 500 can obtain a sequence of gyroscope measurements and a corresponding sequence of magnetometer measurements. Similar to what is described above in connection with block 302 of FIG. 3, in some embodiments, the gyroscope measurements and the magnetometer measurements may be obtained over a time period during which a corresponding gyroscope and magnetometer (e.g., from which the gyroscope measurements and the magnetometer measurements were obtained) were moved in tandem.

At 506, process 500 can determine magnetometer calibration constants and optionally gyroscope calibration constants based on the sequence of gyroscope measurements and the corresponding sequence of magnetometer measurements. For example, as described above in more detail in connection with FIGS. 3 and 4, process 500 can determine two estimates of the derivative of the external magnetic field (e.g., a first estimate based on differences between magnetometer samples, and a second estimate based on a rate of change of angular velocity estimates), and can determine the calibration constants in a manner that minimizes the difference between the two estimates of the derivative of the external magnetic field.

At 508, process 500 can determine an error associated with the determined magnetometer calibration constants. For example, as described above in connection with block 312 of FIG. 3, the error may be a ratio (e.g., q, as described above) of a smallest eigenvalue of a matrix that represents the difference between the two estimates of the derivative of the external magnetic field to the next smallest eigenvalue.

At 510, process 500 can optionally cause an indication of the error to be presented via the user interface. In some implementations, process 500 may indicate the error as a percentage, for example, by multiplying the ratio described above at block 508 by 100. Note that, in some implementations, the user interface may not indicate the current error, and, in such cases, block 510 may be omitted.

At block 512, process 500 can determine whether the calibration process is complete. For example, process 500 may determine that the calibration process is complete responsive to determining that the error determined above at block 508 is below a predetermined threshold (e.g., below 0.05, below 0.1, below 0.15, below 0.2, below 0.25, and/or any other suitable threshold). As another example, process 500 may determine that the calibration process is complete responsive to determining that more than a predetermined duration of time has elapsed since the calibration process began (e.g., more than two minutes, more than three minutes, etc.). As yet another example, process 500 may determine that the calibration process is complete responsive to determining that the user has rotated their head during the calibration process in a region that spans more than a predetermined portion of a sphere surrounding the user's head (e.g., more than a predetermined azimuthal rotation amount and/or more than a predetermined elevational amount).

If, at block 512, process 500 determines that the calibration process is not yet completed ("no" at 512), process 500 can loop back to block 504 and can obtain additional gyroscope measurements and additional magnetometer measurements. Process 500 can then loop through blocks 504-512 until the calibration process has been completed.

Conversely, if, at block 512, process 500 determines that the calibration process is complete ("yes" at 512), process 500 can proceed to block 514 and can store the magnetometer calibration constants and optionally the gyroscope calibration constants. For example, in some implementations, the calibration constants may be stored in association with the device used to perform the calibration routine such that the calibration constants are available and utilized during subsequent usage of the device. As a more particular example, in an instance in which the device is a pair of headphones, the calibration constants may be stored such that the calibration constants are retrieved (e.g., from memory) and utilized during subsequent usage of the headphones by the user.

Turning to FIG. 6, an example of a user interface 600 that may be used for performing a calibration routine is shown in accordance with some embodiments. In particular, user interface 600 may be utilized by a user for calibrating an orientation tracking device that includes one or more magnetometers and one or more gyroscopes. During the calibration routine, the user may move or rotate the orientation tracking device in space while user interface 600 is updated in real-time or in near real-time. In the example of FIG. 6, the orientation tracking device may be disposed in and/or affixed to a head-worn device, such as headphones or a VR/AR headset. Accordingly, the orientation tracking device may indicate a head orientation of the wearer of the head-worn device.

As illustrated, user interface 600 includes a head orientation representation 602. Head orientation representation 602 may indicate in real-time, or near real-time, the current head orientation of the user performing the calibration routine. In some implementations, the head orientation used to construct head orientation representation 602 may be determined based on one or more magnetometers and/or one or more gyroscopes of the orientation tracking device being calibrated.

Additionally, as illustrated, user interface 600 includes a calibration error indication 604. As described above in connection with blocks 508 and 510 of FIG. 5, the calibration error indication 604 may be determined based on an error associated with magnetometer calibration constants determined during the calibration routine as the user moves and/or rotates the orientation tracking device. For example, the calibration error indication 604 may be determined based on a matrix that represents a difference between two different estimates of the derivative of the magnetic field, as described above.

As illustrated, user interface 600 may include a coverage indication 606. Coverage indication 606 indicates a portion of a sphere that the orientation tracking device has been rotated through. In particular, a higher percentage as indicated in coverage indication 606 indicates that the orientation tracking device has been rotated through a larger portion of the sphere. In some implementations, the calibration routine may continue until the portion of the sphere the orientation tracking device has been rotated through has reached a predetermined threshold (e.g., 70%, 80%, 90% or the like). Accordingly, coverage indication 606 may indicate to the user an amount of rotation of the orientation tracking device that has already been performed and/or a remaining amount of rotation to be performed. In some implementations, coverage indication 606 may be updated in real-time or in near real-time.

Figure 7:
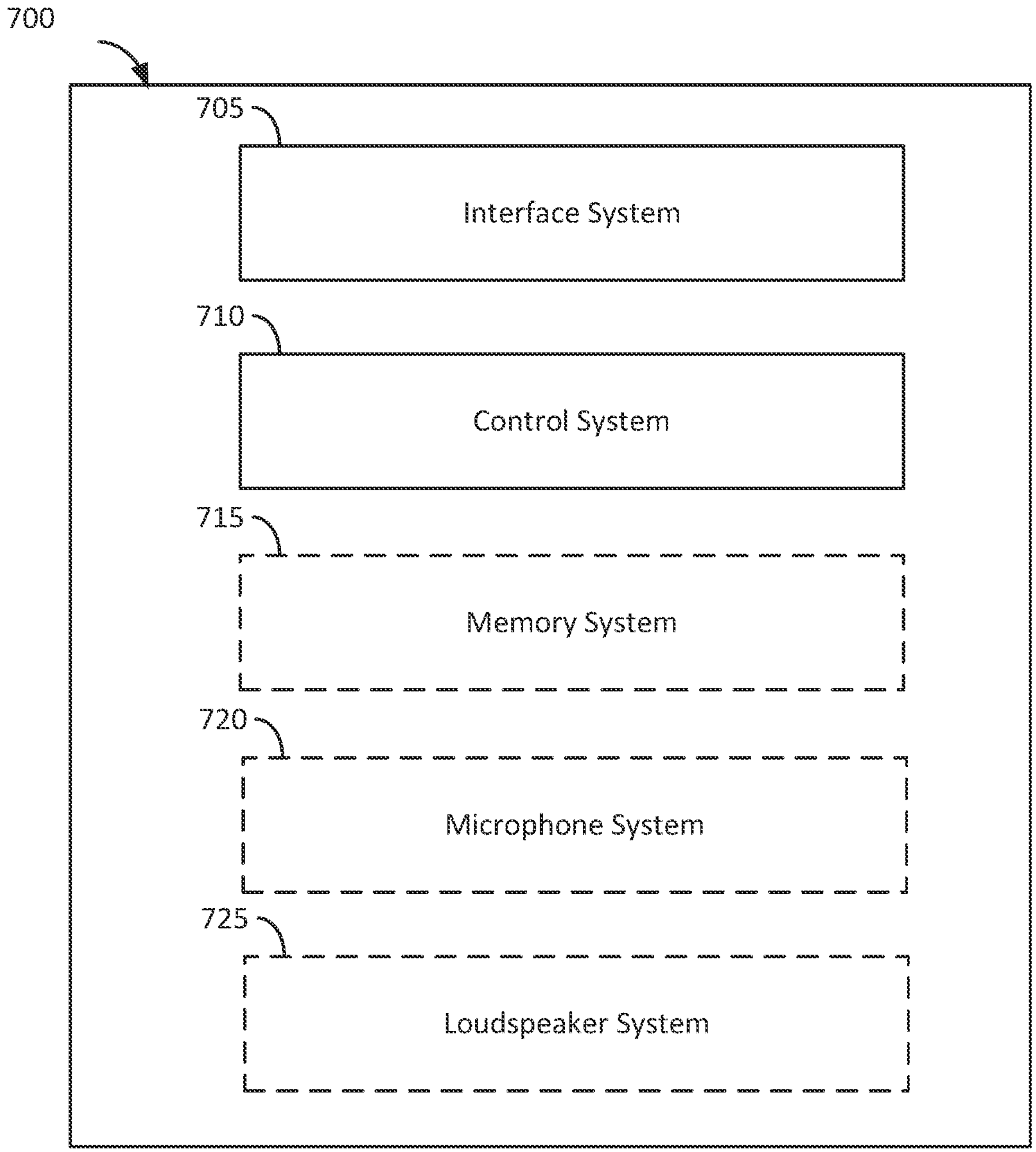
FIG. 7 shows a block diagram that illustrates examples of components of an apparatus capable of implementing various aspects of this disclosure.

FIG. 7 is a block diagram that shows examples of components of an apparatus capable of implementing various aspects of this disclosure. As with other figures provided herein, the types and numbers of elements shown in FIG. 7 are merely provided by way of example. Other implementations may include more, fewer and/or different types and numbers of elements. According to some examples, the apparatus 700 may be configured for performing at least some of the methods disclosed herein. In some implementations, the apparatus 700 may be, or may include, a television, one or more components of an audio system, a mobile device (such as a cellular telephone), a laptop computer, a tablet device, a smart speaker, or another type of device.

According to some alternative implementations the apparatus 700 may be, or may include, a server. In some such examples, the apparatus 700 may be, or may include, an encoder. Accordingly, in some instances the apparatus 700 may be a device that is configured for use within an audio environment, such as a home audio environment, whereas in other instances the apparatus 700 may be a device that is configured for use in "the cloud," e.g., a server.

In this example, the apparatus 700 includes an interface system 705 and a control system 710. The interface system 705 may, in some implementations, be configured for communication with one or more other devices of an audio environment. The audio environment may, in some examples, be a home audio environment. In other examples, the audio environment may be another type of environment, such as an office environment, an automobile environment, a train environment, a street or sidewalk environment, a park environment, etc. The interface system 705 may, in some implementations, be configured for exchanging control information and associated data with audio devices of the audio environment. The control information and associated data may, in some examples, pertain to one or more software applications that the apparatus 700 is executing.

The interface system 705 may, in some implementations, be configured for receiving, or for providing, a content stream. The content stream may include audio data. The audio data may include, but may not be limited to, audio signals. In some instances, the audio data may include spatial data, such as channel data and/or spatial metadata. In some examples, the content stream may include video data and audio data corresponding to the video data.

The interface system 705 may include one or more network interfaces and/or one or more external device interfaces (such as one or more universal serial bus (USB) interfaces). According to some implementations, the interface system 705 may include one or more wireless interfaces. The interface system 705 may include one or more devices for implementing a user interface, such as one or more microphones, one or more speakers, a display system, a touch sensor system and/or a gesture sensor system. In some examples, the interface system 705 may include one or more interfaces between the control system 710 and a memory system, such as the optional memory system 715 shown in FIG. 7. However, the control system 710 may include a memory system in some instances. The interface system 705 may, in some implementations, be configured for receiving input from one or more microphones in an environment.

The control system 710 may, for example, include a general purpose single- or multi-chip processor, a digital signal processor (DSP), an application specific integrated circuit (ASIC), a field programmable gate array (FPGA) or other programmable logic device, discrete gate or transistor logic, and/or discrete hardware components.

In some implementations, the control system 710 may reside in more than one device. For example, in some implementations a portion of the control system 710 may reside in a device within one of the environments depicted herein and another portion of the control system 710 may reside in a device that is outside the environment, such as a server, a mobile device (e.g., a smartphone or a tablet computer), etc. In other examples, a portion of the control system 710 may reside in a device within one environment and another portion of the control system 710 may reside in one or more other devices of the environment. For example, a portion of the control system 710 may reside in a device that is implementing a cloud-based service, such as a server, and another portion of the control system 710 may reside in another device that is implementing the cloud-based service, such as another server, a memory device, etc. The interface system 705 also may, in some examples, reside in more than one device.

In some implementations, the control system 710 may be configured for performing, at least in part, the methods disclosed herein. According to some examples, the control system 710 may be configured for implementing methods of determining magnetometer calibration constants, determining gyroscope calibration constants, presenting user interfaces that guide a user of an orientation tracking device through a calibration process, or the like.

Some or all of the methods described herein may be performed by one or more devices according to instructions (e.g., software) stored on one or more non-transitory media. Such non-transitory media may include memory devices such as those described herein, including but not limited to random access memory (RAM) devices, read-only memory (ROM) devices, etc. The one or more non-transitory media may, for example, reside in the optional memory system 715 shown in FIG. 7 and/or in the control system 710. Accordingly, various innovative aspects of the subject matter described in this disclosure can be implemented in one or more non-transitory media having software stored thereon. The software may, for example, include instructions for determining magnetometer calibration constants, determining gyroscope calibration constants, presenting user interfaces that guide a user of an orientation tracking device through a calibration process, etc. The software may, for example, be executable by one or more components of a control system such as the control system 710 of FIG. 7.

In some examples, the apparatus 700 may include the optional microphone system 720 shown in FIG. 7. The optional microphone system 720 may include one or more microphones. In some implementations, one or more of the microphones may be part of, or associated with, another device, such as a speaker of the speaker system, a smart audio device, etc. In some examples, the apparatus 700 may not include a microphone system 720. However, in some such implementations the apparatus 700 may nonetheless be configured to receive microphone data for one or more microphones in an audio environment via the interface system 710. In some such implementations, a cloud-based implementation of the apparatus 700 may be configured to receive microphone data, or a noise metric corresponding at least in part to the microphone data, from one or more microphones in an audio environment via the interface system 710.

According to some implementations, the apparatus 700 may include the optional loudspeaker system 725 shown in FIG. 7. The optional loudspeaker system 725 may include one or more loudspeakers, which also may be referred to herein as "speakers" or, more generally, as "audio reproduction transducers." In some examples (e.g., cloud-based implementations), the apparatus 700 may not include a loudspeaker system 725. In some implementations, the apparatus 700 may include headphones. Headphones may be connected or coupled to the apparatus 700 via a headphone jack or via a wireless connection (e.g., BLUETOOTH).

Some aspects of present disclosure include a system or device configured (e.g., programmed) to perform one or more examples of the disclosed methods, and a tangible computer readable medium (e.g., a disc) which stores code for implementing one or more examples of the disclosed methods or steps thereof. For example, some disclosed systems can be or include a programmable general purpose processor, digital signal processor, or microprocessor, programmed with software or firmware and/or otherwise configured to perform any of a variety of operations on data, including an embodiment of disclosed methods or steps thereof. Such a general purpose processor may be or include a computer system including an input device, a memory, and a processing subsystem that is programmed (and/or otherwise configured) to perform one or more examples of the disclosed methods (or steps thereof) in response to data asserted thereto.

Some embodiments may be implemented as a configurable (e.g., programmable) digital signal processor (DSP) that is configured (e.g., programmed and otherwise configured) to perform required processing on audio signal(s), including performance of one or more examples of the disclosed methods. Alternatively, embodiments of the disclosed systems (or elements thereof) may be implemented as a general purpose processor (e.g., a personal computer (PC) or other computer system or microprocessor, which may include an input device and a memory) which is programmed with software or firmware and/or otherwise configured to perform any of a variety of operations including one or more examples of the disclosed methods. Alternatively, elements of some embodiments of the inventive system are implemented as a general purpose processor or DSP configured (e.g., programmed) to perform one or more examples of the disclosed methods, and the system also includes other elements (e.g., one or more loudspeakers and/or one or more microphones). A general purpose processor configured to perform one or more examples of the disclosed methods may be coupled to an input device (e.g., a mouse and/or a keyboard), a memory, and a display device.

Another aspect of present disclosure is a computer readable medium (for example, a disc or other tangible storage medium) which stores code for performing (e.g., coder executable to perform) one or more examples of the disclosed methods or steps thereof.

While specific embodiments of the present disclosure and applications of the disclosure have been described herein, it will be apparent to those of ordinary skill in the art that many variations on the embodiments and applications described herein are possible without departing from the scope of the disclosure described and claimed herein. It should be understood that while certain forms of the disclosure have been shown and described, the disclosure is not to be limited to the specific embodiments described and shown or the specific methods described.

The invention claimed is:

1. A method for calibrating magnetometers for motion tracking devices, comprising:

obtaining a sequence of gyroscope measurements from one or more gyroscopes and a sequence of magnetometer measurements from one or more magnetometers, wherein the one or more gyroscopes and the one or more magnetometers are disposed in or on headphones or a head-mounted display;

determining a sequence of angular velocity estimates based on the sequence of gyroscope measurements;

determining a first estimate of a derivative of an external magnetic field based on the sequence of magnetometer measurements;

determining a second estimate of the derivative of the external magnetic field based on the sequence of angular velocity estimates; and identifying magnetometer calibration constants by minimizing an error vector corresponding to a difference between the first estimate of the derivative of the external magnetic field and the second estimate of the derivative of the external magnetic field, wherein the identified magnetometer calibration constants are usable for calibrating an orientation tracking system of the headphones or the head-mounted display.

2. The method of claim 1, wherein the sequence of gyroscope measurements and the sequence of magnetometer measurements are obtained during movement of the orientation tracking system.

3. The method of claim 1, further comprising aggregating the error vector over a plurality of gyroscope measurements of the sequence of gyroscope measurements and a plurality of magnetometer measurements of the sequence of magnetometer measurements.

4. The method of claim 1, wherein determining the first estimate of the derivative of the external magnetic field comprises determining a difference between at least two magnetometer measurements of the sequence of magnetometer measurements.

5. The method of claim 4, wherein the at least two magnetometer measurements span a time duration within a range of 80 milliseconds-120 milliseconds.

6. The method of claim 1, wherein determining the second estimate of the derivative of the external magnetic field comprises determining a product of a matrix indicating a change in the sequence of angular velocity estimates and a magnetic field vector represented by the sequence of magnetometer measurements.

7. The method of claim 1, wherein identifying the magnetometer calibration constants comprises identifying an eigenvector corresponding to a smallest eigenvalue of a matrix that aggregates the error vector over a plurality of gyroscope measurements and a plurality of magnetometer measurements, and wherein elements of the eigenvector correspond to the magnetometer calibration constants.

8. The method of claim 7, further comprising:

determining a second smallest eigenvalue of the matrix; and determining that a second sequence of gyroscope measurements and a second sequence of magnetometer measurements are to be obtained based on a ratio of the smallest eigenvalue to the second smallest eigenvalue.

9. The method of claim 1, wherein the sequence of angular velocity estimates is determined using the sequence of gyroscope measurements adjusted using gyroscope calibration constants, and wherein the gyroscope calibration constants are determined based on gyroscope measurements obtained while the orientation tracking system is held stationary.

10. The method of claim 1, wherein the sequence of angular velocity estimates is determined using an initial set of gyroscope calibration constants, and wherein the method further comprises:

determining a calibration error of the magnetometer calibration constants identified using the initial set of gyroscope calibration constants;

updating the initial set of gyroscope calibration constants based on the calibration error to generate an updated set of gyroscope calibration constants; and determining updated magnetometer calibration constants using the updated set of gyroscope calibration constants.

11. The method of claim 10, wherein the updated set of gyroscope calibration constants are determined using gradient descent to minimize an error of the updated magnetometer calibration constants.

12. The method of claim 1, further comprising: utilizing the magnetometer calibration constants to determine a spatial orientation of the headphones; and modifying spatial characteristics of audio presented via the headphones based at least in part on the spatial orientation of the headphones.

13. The method of claim 12, wherein the spatial characteristics of the audio are modified in near real-time based on a continuous series of determinations of the spatial orientation of the headphones.

14. The method of claim 1, wherein the one or more gyroscopes are configured to measure rotation along three axes, and the one or more magnetometers are configured to measure magnetic field along the three axes.

15. The method of claim 1, further comprising:

determining a calibration error of the identified magnetometer calibration constants; and causing an indication of the calibration error to be presented in a user interface.

16. The method of claim 15, wherein the calibration error is determined based on a ratio of a smallest eigenvalue to a second smallest eigenvalue associated with a matrix representative of the difference between the first estimate of the derivative of the external magnetic field and the second estimate of the derivative of the external magnetic field.

17. The method of claim 15, further comprising:

obtaining a second sequence of gyroscope measurements and a second sequence of magnetometer measurements;

identifying updated magnetometer calibration constants associated with the second sequence of gyroscope measurements and the second sequence of magnetometer measurements;

determining a second calibration error of the updated magnetometer calibration constants; and updating the user interface with an indication of the second calibration error.

18. An apparatus configured for implementing the method of claim 1.

19. One or more non-transitory media having software stored thereon, the software including instructions for controlling one or more devices to perform the method of claim 1.

* * * * *